United States Patent
Hisch

(10) Patent No.: US 10,651,956 B2
(45) Date of Patent: May 12, 2020

(54) PORTABLE DIRECTIONAL ANTENNA, MEASUREMENT ARRANGEMENT AND MEASUREMENT METHOD

(71) Applicant: Rohde & Schwarz GmbH & Co. KG, Munich (DE)

(72) Inventor: Martin Hisch, Forstinning (DE)

(73) Assignee: ROHDE & SCHWARZ GMBH & CO. KG, Munich (DE)

( * ) Notice: Subject to any disclaimer, the term of this patent is extended or adjusted under 35 U.S.C. 154(b) by 40 days.

(21) Appl. No.: 15/064,594

(22) Filed: Mar. 8, 2016

(65) Prior Publication Data

US 2016/0323048 A1 Nov. 3, 2016

(30) Foreign Application Priority Data

Apr. 29, 2015 (EP) .................................... 15165568

(51) Int. Cl.
*H04B 17/27* (2015.01)
*H04N 1/21* (2006.01)
(Continued)

(52) U.S. Cl.
CPC .......... *H04B 17/27* (2015.01); *G01R 29/0842* (2013.01); *G01R 29/0878* (2013.01);
(Continued)

(58) Field of Classification Search
CPC ............ G01R 29/0842; G01R 29/0878; H01C 1/273; H04B 17/27; H04N 1/2125; H04N 7/185; H01Q 1/273
(Continued)

(56) References Cited

U.S. PATENT DOCUMENTS 4,631,473 A * 12/1986 Honda ............... G01R 29/0835
324/102
5,886,672 A 3/1999 Brune et al.
(Continued)

FOREIGN PATENT DOCUMENTS

DE 10 2010 051213 A1 5/2012
EP 1141748 B1 10/2001
(Continued)

OTHER PUBLICATIONS

European search report for Patent Application No. 15165568.5 (dated Oct. 30, 2015).
(Continued)

*Primary Examiner* — Mohammed Jebari
(74) *Attorney, Agent, or Firm* — Shumaker & Sieffert, P.A.

(57) ABSTRACT

The present invention relates to a portable directional antenna which is equipped with a camera which is integrated into the housing of the directional antenna. In addition to the conventional documentation of the position-finding information, this integrated, installed camera makes it possible, by means of the directional antenna function, to also optically document the surroundings of the interference source with a variable level of detail, for example by way long-range or short-range capture. By way of the optical additional information thus obtained, the present invention provides a simple, but nonetheless very effective, enhanced documentation option for interference sources and the surroundings thereof. Thus, during the search for radio-frequency interferences, no separate camera for capturing image information has to be brought along, and this increases the comfort for a user. The present invention further relates to a portable measurement arrangement and to
(Continued)

a method for measuring an electromagnetic signal emitted by a source.

14 Claims, 7 Drawing Sheets

(51) Int. Cl.
    *H04N 7/18*     (2006.01)
    *G01R 29/08*     (2006.01)
    *H01Q 1/27*     (2006.01)
    *G01S 3/04*     (2006.01)
    *G01S 5/12*     (2006.01)
    *G01S 11/16*     (2006.01)

(52) U.S. Cl.
    CPC ............... *G01S 3/04* (2013.01); *G01S 5/12* (2013.01); *G01S 11/16* (2013.01); *H01Q 1/273* (2013.01); *H04N 1/2125* (2013.01); *H04N 7/185* (2013.01)

(58) Field of Classification Search
    USPC ........................................................ 348/158
    See application file for complete search history.

(56) References Cited

U.S. PATENT DOCUMENTS

| | | | |
|---|---|---|---|
| 5,889,672 A | 3/1999 | Schuler et al. | |
| 2007/0038402 A1* | 2/2007 | Zhang | H05K 9/00 702/117 |
| 2007/0205886 A1* | 9/2007 | Huseth | A62B 9/006 340/539.15 |
| 2009/0192736 A1* | 7/2009 | McCullough | G01R 29/0871 702/60 |
| 2009/0210177 A1* | 8/2009 | McCullough | G01R 29/0871 702/60 |
| 2009/0278849 A1* | 11/2009 | Williams | G06T 11/206 345/441 |
| 2011/0123187 A1* | 5/2011 | Bowern | G01S 19/14 396/310 |
| 2011/0250928 A1* | 10/2011 | Schlub | H01Q 1/243 455/550.1 |
| 2012/0056722 A1* | 3/2012 | Kawaguchi | G06K 7/10009 340/10.1 |
| 2012/0306886 A1* | 12/2012 | Bernard | G09G 5/39 345/440.1 |
| 2013/0002868 A1* | 1/2013 | Yoshimitsu | G08B 13/19608 348/143 |
| 2013/0049925 A1* | 2/2013 | Subramanian | G06K 7/10079 340/3.1 |
| 2014/0036065 A1* | 2/2014 | Oakley | G01S 3/46 348/135 |
| 2015/0094104 A1* | 4/2015 | Wilmhoff | H01Q 1/241 455/457 |

FOREIGN PATENT DOCUMENTS

| | | |
|---|---|---|
| EP | 2 696 213 A2 | 2/2014 |
| WO | 2014045495 A1 | 3/2014 |

OTHER PUBLICATIONS

Response to Office Action dated Oct. 6, 2017, from counterpart European Application No. 15165568.5, filed Jan. 6, 2018, 10 pp.
"ARC-RP3M," Handheld Direction Finder, IRCOS JSC, http://www.ircos.ru/en/hhd_rp3m.html, Retrieved Dec. 9, 2019 4 pages.

* cited by examiner

PORTABLE DIRECTIONAL ANTENNA, MEASUREMENT ARRANGEMENT AND MEASUREMENT METHOD

PRIORITY CLAIM

This application claims the benefit of European Application No. 15165568.5, filed Apr. 29, 2015; the disclosure of which is incorporated herein by reference in its entirety.

FIELD OF THE INVENTION

The present invention relates to a portable directional antenna. The present invention also relates to a portable measurement arrangement and to a method for measuring an electromagnetic signal emitted by a source.

TECHNICAL BACKGROUND

The present invention relates to the detection of radio-frequency interferences. Radio-frequency interference (often also referred to as electromagnetic interference) refers to the effect of undesired energy resulting from emission, broadcasting or induction (or from a combination thereof), which can have a negative effect on the reception in a radio system. The present invention and the set of problems on which it is based are described in the following in relation to radio-frequency interferences in the field of mobile radio, but without limiting the invention thereto.

Causes of radio-frequency interferences in the field of mobile radio may be defective antennae on a mobile radio mast. To locate an interference source of this type, directional antennae are used, for example. Directional antennae are receivers having a directional receiving characteristic which is amplified as a result of the design. As a receiving antenna, a directional antenna thus concentrates the maximum receiving sensitivity thereof in a desired direction, using an opening angle that is smaller or less small depending on the application. As a result of the directional effect, the reception of signals outside the primary lobe of the electromagnetic signal is attenuated.

A directional antenna of this type is disclosed for example in DE 10 2010 051 213 A1. Using a directional antenna of this type, an interference source can be detected, and the exact GPS position can be determined by means of an installed GPS sensor.

However, even with a directional antenna equipped with a GPS sensor, and thus even if the GPS position is known, it may not be possible to find the interference source retrospectively, for example if a plurality of interference sources are positioned close together, as may be the case in urban environments. Furthermore, radio-frequency interferences also occur inside buildings, where for example there is no GPS reception.

SUMMARY OF THE INVENTION

Against this background, the object of the invention is to provide improved re-identification of a detected interference source.

According to the invention, this object is achieved by a directional antenna having the features of claim 1 and/or by a measurement arrangement having the features of claim 10 and/or by a method having the features of claim 14.

Accordingly, the following is provided;

A portable directional antenna, which is designed to detect position-finding data of an interference source emitting an electromagnetic interference signal, comprising an installed camera which is configured to capture image information from the surroundings of the directional antenna, in particular from the surroundings of the interference source.

A measurement arrangement comprising a directional antenna according to the invention, comprising a measurement device designed as a spectrum analyser, which is coupled to the directional antenna and which is designed to analyse an electromagnetic interference signal, received by the directional antenna, from an interference source.

A method for locating a radio-frequency interference source, comprising the following steps: determining the position of an interference source by detecting and evaluating an electromagnetic signal emitted by the interference source and by providing position-finding data from a direction of incidence of the detected electromagnetic signal; capturing image information from the surroundings of the interference source and/or from a location at which the electromagnetic signal was detected; storing the determined position and the associated image information.

The idea behind the present invention is to equip a directional antenna known per se with a camera which is integrated into the housing of the directional antenna. In addition to the conventional documentation of the position-finding information, this integrated, installed camera makes it possible, by means of the directional antenna function, to also optically document the surroundings of the environment of the interference source with a variable level of detail, for example by way of long-range or short-range capture. By way of the optical additional information thus obtained, the present invention provides a simple, but nonetheless very effective, enhanced documentation option for interference sources and the surroundings thereof. Thus, during the search for radio-frequency interferences, no separate camera for capturing image information has to be brought along, and this increases the comfort for a user.

Advantageous configurations and developments may be taken from the further, dependent claims and from the description with reference to the drawings.

In a preferred embodiment, the camera is in the form of a digital camera. A digital camera conventionally comprises an integrated memory, which according to the invention is used to store detected position-finding data and image information. In particular, it is thus possible to store the position-finding data captured by the directional antenna and the image information captured by the camera thereof in an associated manner. As a result, the corresponding associated image information is automatically assigned to the detected position-finding data, which simplifies subsequent analysis. In addition, this reduces the amount of human labour, since said data no longer have to be specially identified and combined in subsequent data processing. In addition, as a result of this type of associated data store, it is possible to prevent errors due to subsequent incorrect combination of data, for example caused by the user no longer being able to tell which image data belong with which image information. Alternatively, it is also conceivable to configure the camera as an analogue camera, COD sensor or the like.

In a further preferred embodiment, the directional antenna comprises a GPS sensor. This GPS sensor is designed to detect GPS position data of the location at which the position-finding data and/or the image information were captured. GPS data are particularly advantageous during a search for interference sources outside buildings and in a spacious environment, since in this way a more or less distinct position of the interference source is provided. It is particularly advantageous if the position-finding data and/or the image information are in effect provided with an electronic GPS position stamp. Alternatively, associated GPS position data, position-finding data and/or image information may also be stored separately from one another.

In a further embodiment, the directional antenna additionally comprises a device for time detection so as to obtain time information associated with the position-finding data and/or image information. The time information may for example be stored as a timestamp based on the position-finding data or image information. This ensures that associated position-finding data and image information can be identified exactly, even in the case of large datasets. In addition, documenting a time, a date and/or a duration is significant and advantageous in particular in the case of interference signals which merely occur temporarily, intermittently etc. Furthermore, assigning position-finding data to time information also makes it possible to document any noise that interferes with the electromagnetic signal.

In a further, particularly preferred embodiment, the directional antenna has a control device coupled to the camera. The control device is preferably designed to trigger the camera automatically in a manner depending on a predetermined condition. In particular, it is advantageous if the predetermined condition is at least in the form of a threshold for the electromagnetic signal. A threshold for the electromagnetic signal may for example be an amplitude, a signal intensity, a signal scattering, a particular predetermined noise and/or a frequency of the electromagnetic interference signal. For example, it may be provided that the camera triggers automatically if the directional antenna qualifies a detected signal as an interference signal, for example by way of the signal characteristic. Alternatively, the predetermined condition may also be a time specification. For example, it would be conceivable to trigger the camera at intervals, for example every 30 seconds. Of course, other conditions would also be conceivable. Alternatively, it would be conceivable for the control device to trigger the camera in a manner depending on the user, for example upon a button input by the user.

It is also advantageous if the predetermined condition can be set in a manner specific to the user, in particular during the operation of the directional antenna. This ensures that the control device is adapted to specific circumstances, such as environmental circumstances (for example position-finding in a closed building, in urban environments etc.).

In a further embodiment, the directional antenna comprises a distance measurement device. By means of the distance measurement device, a distance between the directional antenna and the interference source can be determined, making it possible to improve the manner in which the position of the interference source is determined. In addition, this makes it possible to evaluate the quality of the emitted interference signal received by the directional antenna in a more effective manner. Preferably, the distance measurement device is designed as a directional microphone. A directional microphone is a type of microphone which primarily captures the frontally incident sound and thus has a directional characteristic. Sound from other directions is converted into electrical signals in a more attenuated manner. By means of a directional microphone, the distance can be determined from a difference in delay time between the electromagnetic signal and a sound signal which was emitted at the same time as the electromagnetic signal from the interference source.

In a further embodiment, a directional antenna of this type is provided which is designed for receiving electromagnetic signals in a frequency range between 9 kHz and 7.5 GHz. Preferably, there are different types of directional antenna for interference signals of different frequencies. It is particularly advantageous if the directional antenna is configured for receiving electromagnetic signals in a frequency range between 9 kHz and 20 MHz and/or between 20 MHz and 200 MHz and/or between 200 MHz and 500 MHz and/or 500 MHz and 7.5 GHz.

In a particularly preferred development, the directional antenna according to the invention is designed to detect, locate and document interference signals emitted by an interference source. Preferably, this is carried out fully automatically by involving the control device. The term "documenting" refers for example to storing all of the detected data relating to the interference source.

In another preferred embodiment of the measurement arrangement, an input device is provided so as to document further information, for example on the position, nature, type etc, of the interference source, as a result of user input. The input device may typically be designed as a button, keypad, touchpad, haptic sensor, a microphone having speech recognition, gesture recognition device etc. In this way, additional information, for example regarding the quality of the data or regarding a description of various relevant interference sources, observations by the user etc, can be recorded in a particularly simple manner and assigned to the captured data.

In a further embodiment of the measurement arrangement, a control device is provided so as to assign the user-specific inputs to the captured image information and/or to the detected position-finding data. In this way, the detected information, such as the detected position-finding data, image information, GPS data, time information, user inputs etc. can be stored as associated information.

In a further embodiment of the measurement arrangement, a display device is provided. By means of the display device, the detected information, such as the detected position-finding data, image information, GPS data, time information, user inputs etc. can be displayed individually or as associated information. The display device is for example formed as a monitor, display, screen, such as an LCD screen, plasma screen, FED screen, CRT screen and the like.

The above configurations and developments can be combined with one another in any desired manner, within reason. Further possible configurations, developments and implementations of the invention also comprise combinations not explicitly mentioned of features of the invention which are set out above or in the following in relation to the embodiments. In particular, in this context, a person skilled in the art will also add individual aspects as improvements or additions to the relevant basic form of the present invention.

DESCRIPTION OF THE DRAWINGS

In the following, the present invention is described in greater detail by way of the embodiments shown in the schematic drawings, in which.

Figure 1:
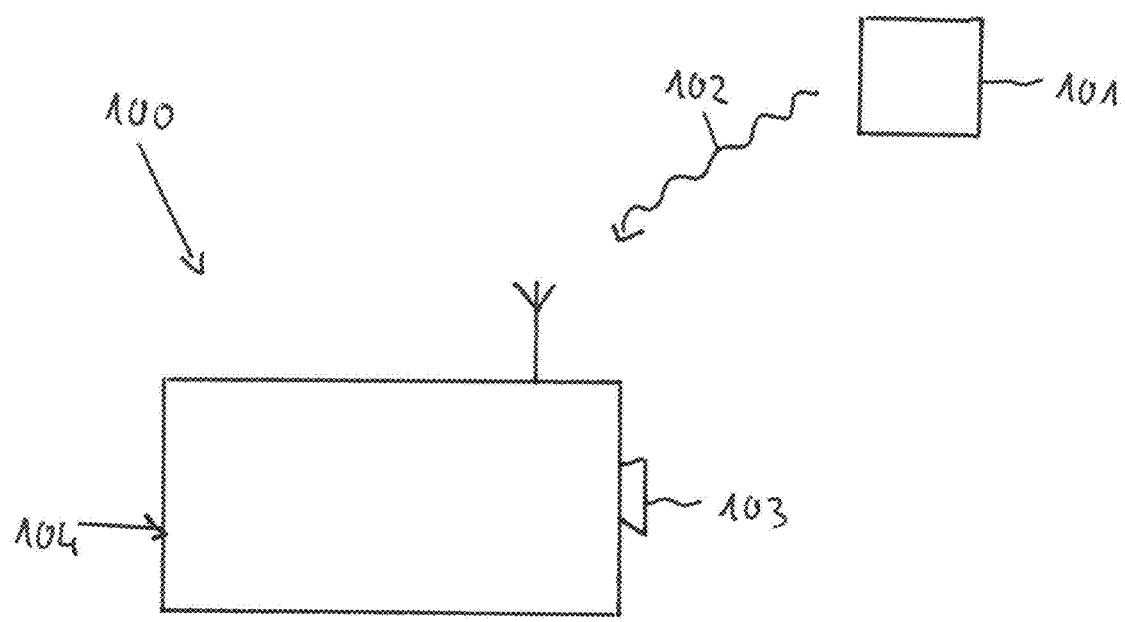
FIG. 1 shows a first, general embodiment of a directional antenna according to the invention.

The accompanying drawings are intended to give an improved understanding of the embodiments of the invention. They illustrate embodiments and are intended to clarify principles and concepts behind the invention, in conjunction with the description. Other embodiments and many of the stated advantages can be seen from the drawings. The elements of the drawings are not necessarily shown to scale with one another.

In the drawings, like, functionally identical and equivalent elements, features and components are provided with like reference numerals unless stated otherwise.

DESCRIPTION OF EMBODIMENTS

FIG. 1 is a schematic view of a first, general embodiment of a directional antenna 100 according to the invention for locating radio-frequency interference sources. The directional antenna 100 is designed to receive and analyse an electromagnetic signal 102 which is generated and broadcast for example by an interference source 101 such as a defective household appliance, a mobile radio transmitter or the like.

The directional antenna 100 according to the invention comprises a camera 103, which may be an analogue camera or digital camera and which is for example embedded in the housing 104 of the directional antenna 100. By means of the directional antenna 100 according to the invention comprising an integrated camera 103, a functionally expanded directional antenna 100 is provided. In particular, the directional antenna 100 makes it possible to document the location, the environment, the exact position, the type and nature etc. of the interference source 101 in a particularly efficient and convenient manner by the camera 103 capturing image information from the interference source 101 or the surroundings thereof.

The camera 103 may be designed as a photo camera for capturing individual images or as a video camera for capturing image sequences.

Figure 2:
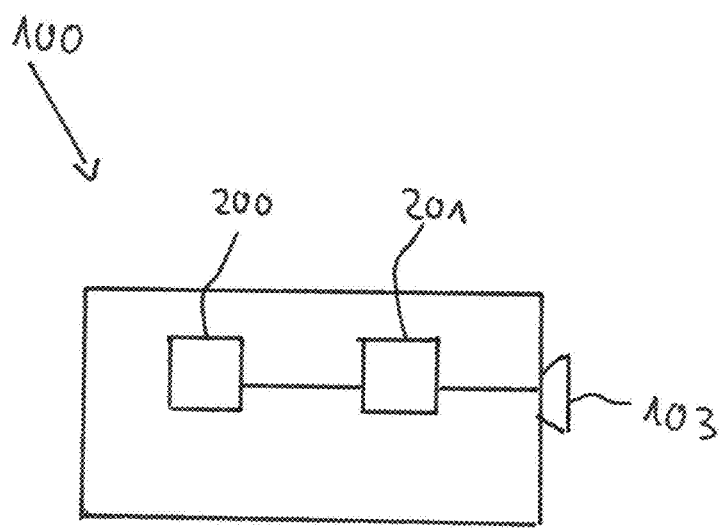
FIG. 2-5 show further embodiments of a directional antenna according to the invention.

FIG. 2 is a schematic view of a further embodiment of a directional antenna 200 according to the invention. In this case, the directional antenna 100 comprises a storage medium 200 for storing the image information captured by the camera 103 and further information such as position-finding data. In the case of a digital camera 103, the storage medium 200 may already be integrated into the camera 103. In this case, the storage medium 200 is an electronic memory 200, such as a DRAM, SRAM, graphical memory, memory card, hard disk or the like. It would also be conceivable for the storage medium 200 to be formed as an external memory and for example to be able to be coupled to the directional antenna 100 via an I/O interface (not shown).

The directional antenna 100 further comprises a control device 201, which is coupled both to the camera 103 and to the memory 200. The control device 201 controls the functionality of the directional antenna 100 and the camera 103 and memory 200 thereof. For example, it may be provided that the control device 201 triggers automatically in a manner depending on a predetermined condition. The predetermined condition may for example be that of exceeding a particular predetermined threshold, for example relating to the amplitude, intensity, scattering and/or frequency of the detected electromagnetic interference signal 102.

Figure 3:
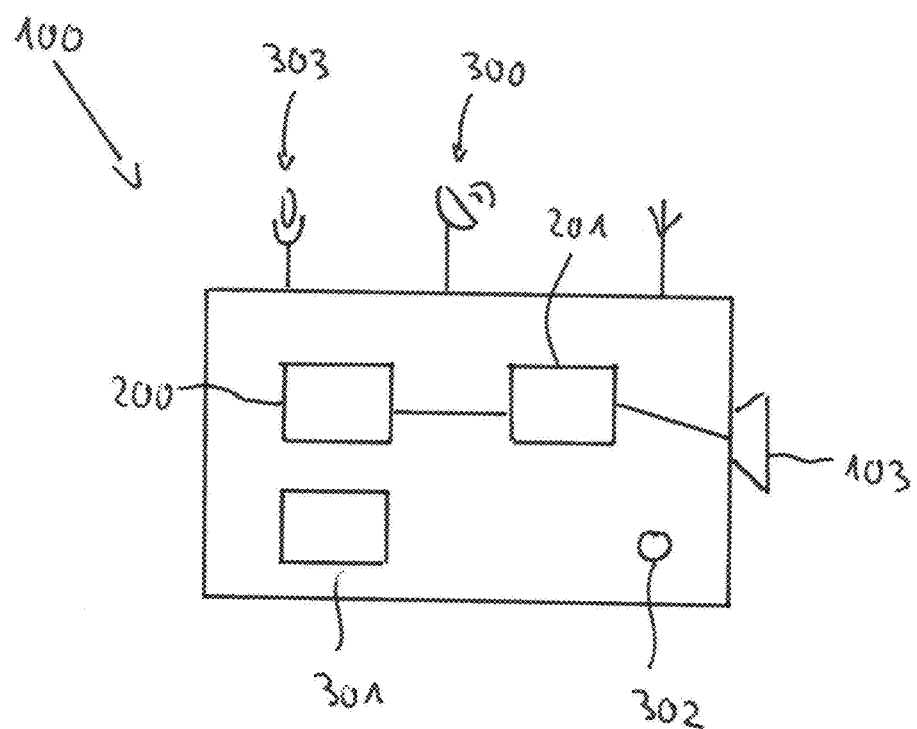

FIG. 3 is a schematic view of a further embodiment of a directional antenna 100 according to the invention. In this case, in addition to the camera 103, memory 200 and control device 201, the directional antenna 100 comprises a GPS sensor 300 for determining the position of the directional antenna 100. The GPS sensor 300 is coupled to the memory 200 so as to store the obtained position data therein. The GPS sensor 300 thus makes it possible for image information detected by the camera 103 and position-finding data detected by the directional antenna 100 each to be provided with a position stamp, in such a way that associated image and position-finding data can subsequently be identified in a simpler manner by way of the position stamp.

The directional antenna 100 further comprises a device 301 for time detection. Since data which were detected at (virtually) the same time were generally also detected at (virtually) the same location, it is also possible to carry out particularly precise position assignment of the detected data using the device 301.

Furthermore, the directional antenna 100 comprises an actuation device 302 for actuating the camera 103. In this embodiment, the actuation device 302 is designed as a trigger button 302, by means of which the camera 103 is triggered by a user. However, the camera 103 could also be controlled by means of the actuation device 302.

The directional antenna 100 further comprises a directional microphone 303 for receiving a sound signal which is emitted by an interference source 101 at the same time as the electromagnetic interference signal 102. By means of the directional microphone 303, a difference in delay time between the delay time of the electromagnetic interference signal 102 and the sound signal is detected, by way of which the distance from the interference source 101 to the directional antenna 100 can be determined.

For easier handling by a user, the directional antenna 100 is additionally equipped with a handle 304.

Figure 4:
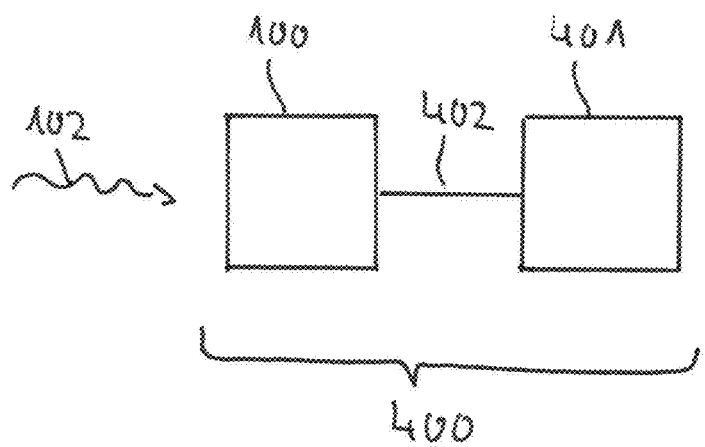

FIG. 4 is a schematic view of a first embodiment of a measurement arrangement 400 according to the invention for detecting and locating electrical radio-frequency interference source. The measurement arrangement 400 comprises a directional antenna 100 of the type disclosed above by way of FIGS. 1 to 3, and a spectrum analyser 401.

A spectrum analyser 401 is a measurement device used in electrical measurement for detecting and displaying a signal in the frequency range. The display is usually provided on a screen installed in the measuring device, the horizontal axis (x-axis) being the frequency axis and the amplitude of the signal being shown on the vertical axis (y-axis). The resulting image is referred to as a frequency spectrum. Spectrum analysers 401 are used inter alia in the field of high-frequency technology.

Using the measurement arrangement 400 according to the invention, it is possible to initially detect and characterise an electromagnetic interference signal 102 by means of the spectrum analyser 401 and to subsequently locate the detected and characterised interference signal 102 by means of the directional antenna 100.

The measurement arrangement 400 may be formed in a single piece. In this case, the spectrum analyser 401 would already be integrated into the directional antenna 100 (or vice versa). However, it is advantageous if the measurement arrangement 400 is formed in two pieces, as is shown in FIG. 4. In this case, a first part of the measurement arrangement 400 comprises the directional antenna 100 and a second part of the measurement arrangement 400 comprises the spectrum analyser 401. In this case, the directional antenna 100 and the spectrum analyser 401 are to be coupled to one another for example by means of a radio connection or a connection cable 402.

Figure 5:
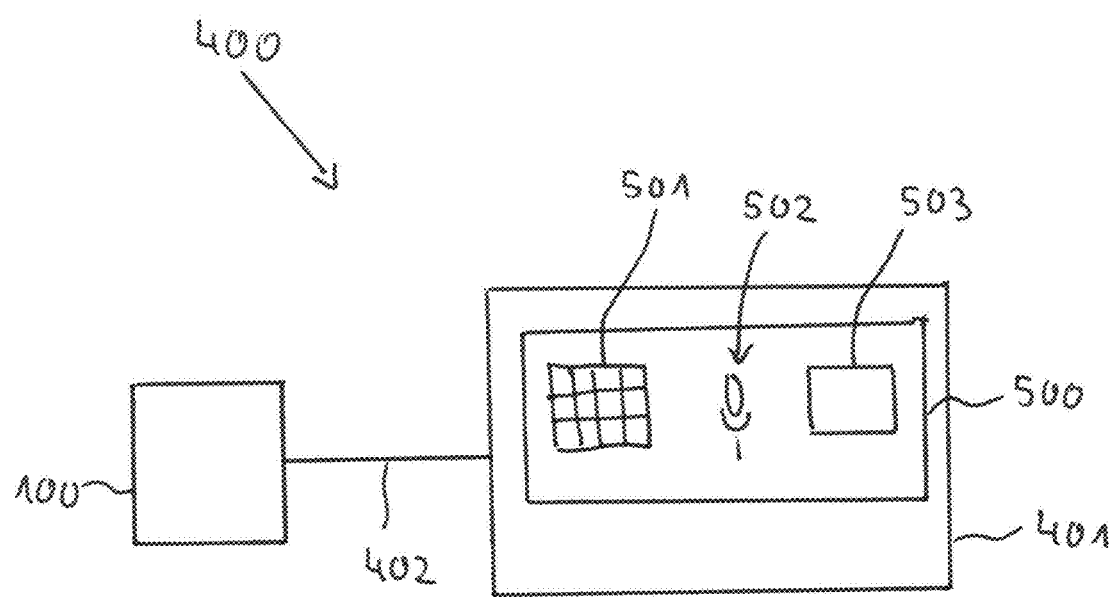

FIG. 5 shows a further embodiment of a measurement arrangement 400 according to the invention. In this case, the spectrum analyser 401 comprises an input device 500, via which user-specific additional information can be inputted and can be stored together with the associated position-finding data and image information. In this case, the input device 500 comprises a keypad 501, a microphone 502 for inputting a voice memo and a touchscreen 503.

Figure 6:
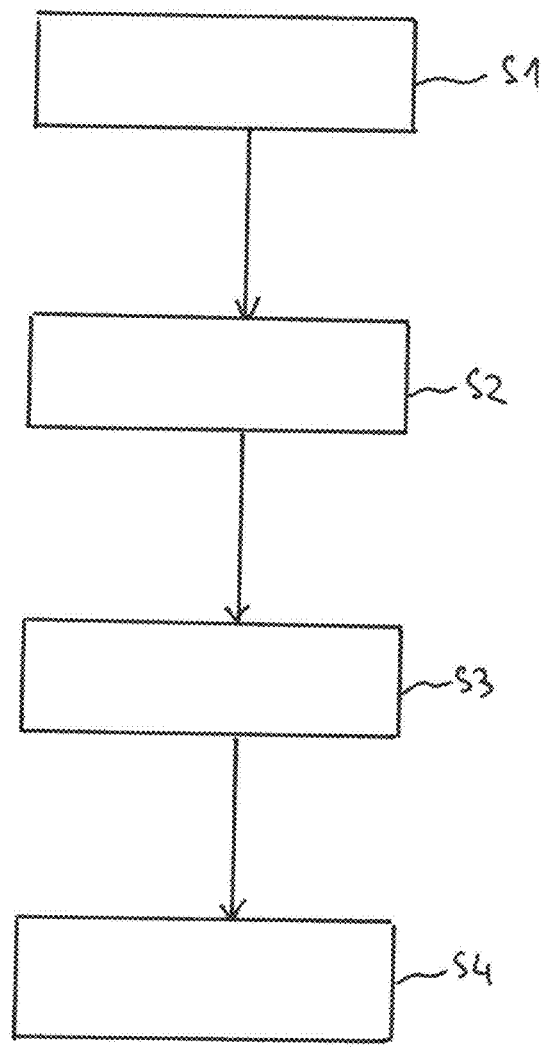
FIG. 6 is a flow chart illustrating the method according to the invention.

FIG. 6 is a flow diagram illustrating the individual steps of the method according to the invention for measuring an electromagnetic signal emitted by an interference source.

Initially, in a first step S1, an electromagnetic interference signal generated by an interference source is detected and evaluated, for example by analysing a characteristic of the interference signal in terms of the frequency, amplitude, intensity etc. thereof.

In a further step S2, a direction of incidence of the detected electromagnetic signal is determined.

The steps S1, S2 may be repeated iteratively, in such a way that the user can optimally approximate the direction of incidence of the detected electromagnetic signal.

During or subsequent to these search and optimisation steps S1 and S2, in step S3 at least one image of the environment in which the electromagnetic signal was detected is captured.

In a subsequent step S4, the detected data and information captured and measured in steps S1, S2 and S3 are stored. To reduce post-processing work, associated data are stored cohesively or labelled in such a way that, after storage, associated data can be detected by a sorting algorithm as being associated.

FIG. 7A-7D show further embodiments of a directional antenna 100 according to the invention. Instead of a GPS sensor 300, as in the embodiment of FIG. 3, this directional antenna 100 is equipped with a compass 305 for position determination.

Figure 7A:
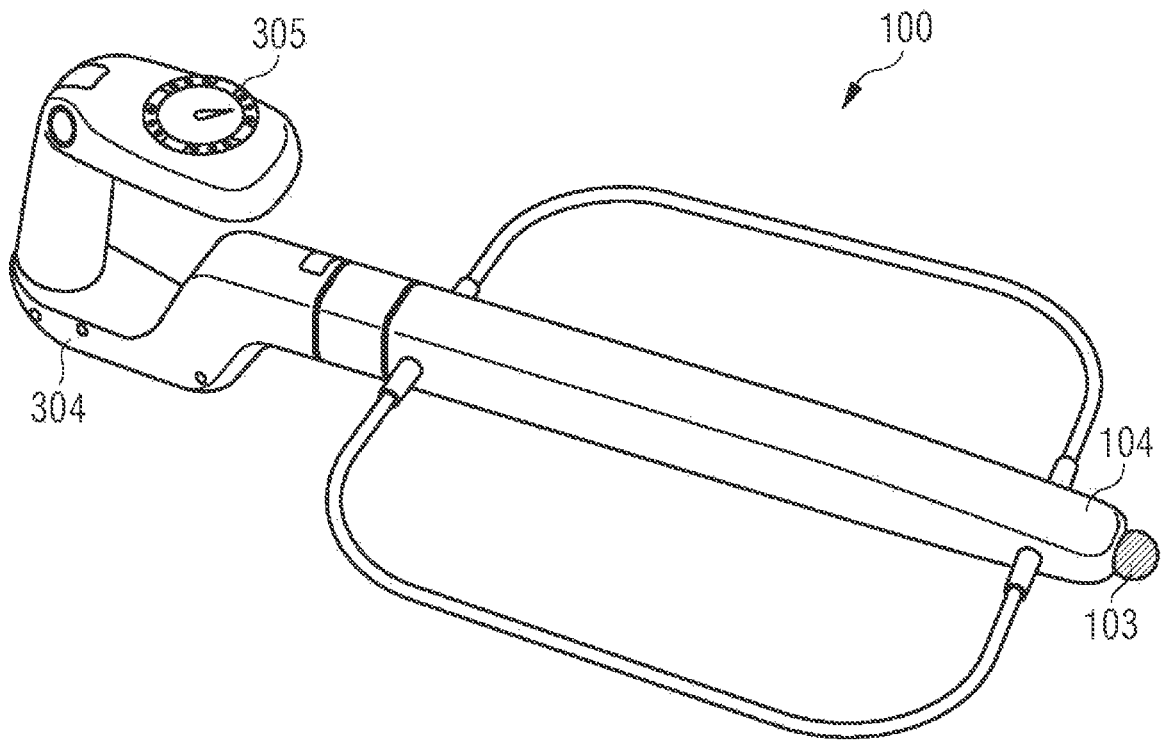
FIG. 7A-7D show further embodiments of a directional antenna according to the invention.
Figure 7B:
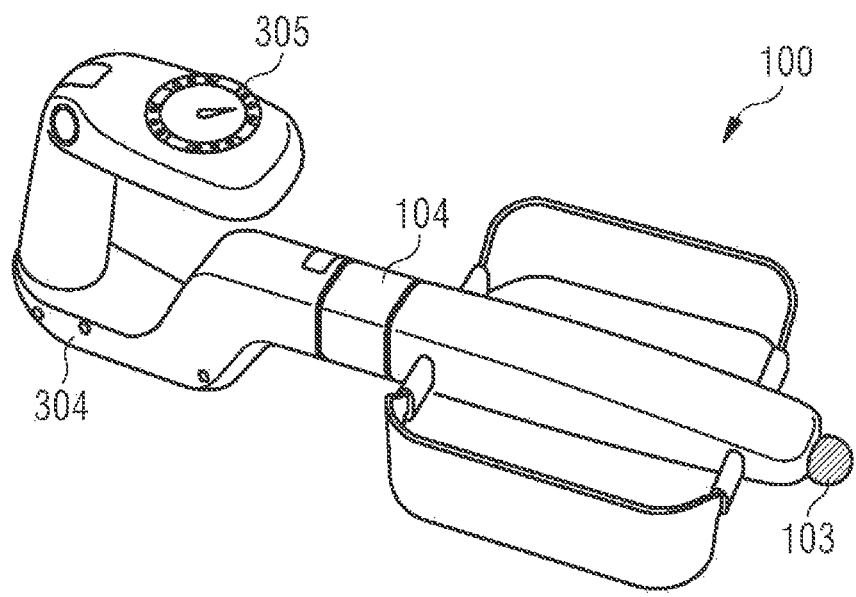
Figure 7C:
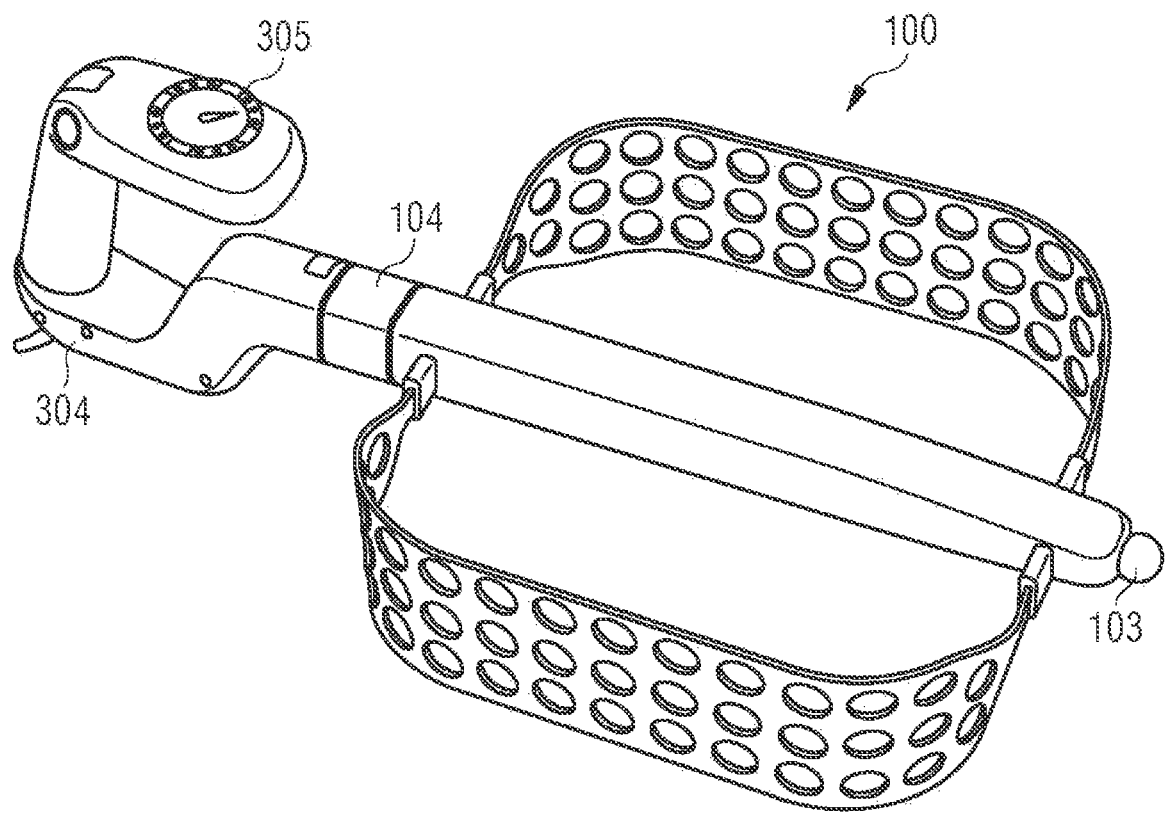
Figure 7D:
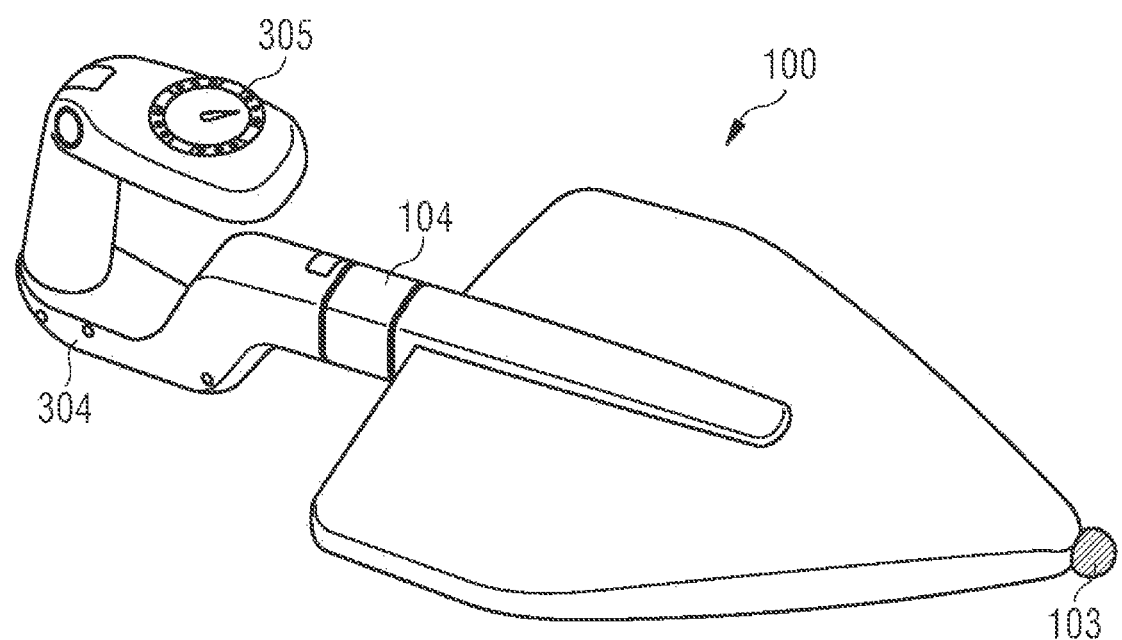

The various directional antennae 100 of FIG. 7A-7D are distinguished by different receiving sensitivities towards the interference signals to be detected. Thus, for example, the directional antenna 100 in FIG. 7A is configured for a frequency range of 9 kHz to 20 MHz. The directional antenna 100 in FIG. 7B is configured for a frequency range of 200 MHz to 500 MHz. The directional antenna 100 in FIG. 7C is configured for a frequency range of 20 MHz to 200 MHz. The directional antenna 100 in 7D is configured for a frequency range of 0.5 GHz to 7.5 GHz.

Figure 8:
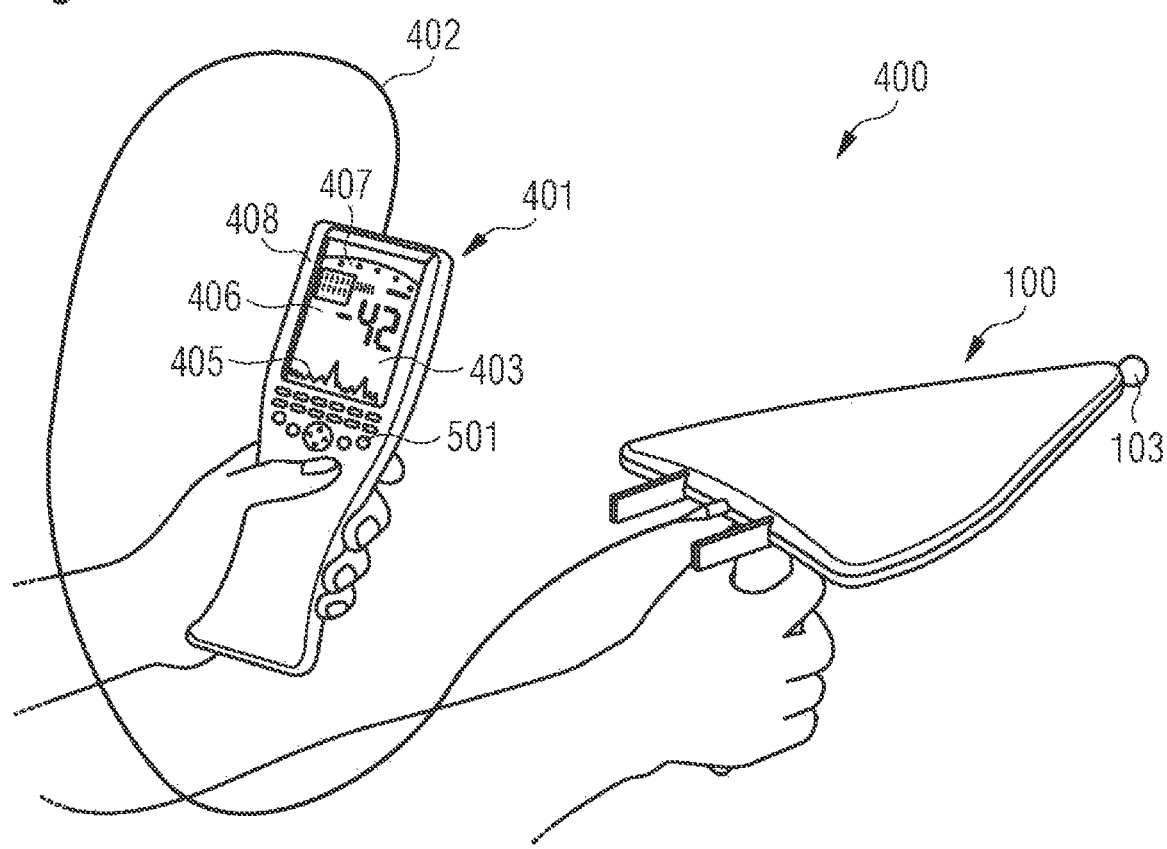
FIG. 8 shows a further embodiment of a measurement arrangement according to the invention.

FIG. 8 shows a further embodiment of a measurement arrangement 400 according to the invention comprising a spectrum analyser 401 and a directional antenna 100. In this embodiment, in FIG. 8, the spectrum analyser 401 is connected to the directional antenna 100 via a coaxial cable 404. Alternatively, wireless coupling of the spectrum analyser 401 and the directional antenna 100 may also be provided, for example by Bluetooth, IR, radio etc.

In this case, the spectrum analyser 401 comprises an input device 500 in the form of a keypad 501. In addition, a display 403 is provided, on which data from the interference signal which are detected by the directional antenna 100 are displayed. In this embodiment, the display 403 shows a frequency spectrum 405 of the detected interference signal. In addition, the signal intensity 406 detected by the spectrum analyser 401 is shown. Furthermore, the display 403 shows the position-finding data detected by the directional antenna 100 on an angle scale 407. According to the invention, an image 408 captured by the camera 103 is now also shown on the display 403.

Although the present invention has been disclosed by way of preferred embodiments, it is not limited thereto, but can be modified in various ways. Thus, the detailed description of embodiments of the invention is merely exemplary in nature, and is not intended to limit the invention or the range of application or the applications of the invention. In particular, the values stated or shown in the embodiments are merely exemplary in nature and may vary depending on the field of application of the invention.

LIST OF REFERENCE NUMERALS

100 Directional antenna
101 Interference source
102 Interference signal
103 (Analogue or digital) camera
104 Housing
200 Memory
201 Control device
300 GPS sensor
301 Device for time detection
302 Actuation device
303 Directional microphone, distance measurement device
304 Handle
305 Compass
400 Measurement arrangement
401 Spectrum analyser
402 Connection cable
403 Display
404 Coaxial cable
405 Frequency spectrum
406 Intensity
407 Angle scale
408 (Camera) image
500 input device
501 Keypad
502 Microphone
503 Touchscreen
S1-S4 Steps

The invention claimed is:

1. A portable directional antenna, which is designed to detect position-finding data of an interference source emitting an electromagnetic interference signal, comprising an installed camera which is configured to capture image information from the surroundings of the directional antenna, in particular from the surroundings of the interference source, and comprising a control device configured to control the camera and the portable directional antenna, wherein the control device is configured to adjust the size of the opening angle of the portable directional antenna to become smaller or bigger, wherein the control device is coupled to the camera and is designed so as to trigger the camera in a manner dependent on a predetermined condition, wherein the control device is designed to trigger the camera automatically in a manner dependent on the predetermined condition, the predetermined condition denoting at least one threshold for the detected electromagnetic signal, and wherein the threshold for the detected electromagnetic signal is a threshold for the scattering of the detected electromagnetic interference signal.

2. The antenna of claim 1, wherein the camera is in the form of a digital camera which comprises a memory so as to store image information captured by the digital camera or position-finding data associated with the image information or both of them.

3. The antenna of claim 1, wherein a GPS sensor is provided which is designed to detect GPS position data associated with the position-finding data or image information or both of them.

4. The antenna of claim 1, wherein a device for time detection is provided which is designed to detect time information associated with the position-finding data or image information or both of them.

5. The antenna of claim 1 wherein the predetermined condition can be set in a user-specific manner by way of an input device.

6. The antenna of claim 1, wherein a distance measurement device is provided, which is arranged and designed so as to determine a distance between the directional antenna and the interference source.

7. The antenna of claim 6, wherein the distance measurement device is a directional microphone.

8. The antenna of claim 1, wherein the directional antenna is designed to receive electromagnetic interference signals in a frequency range between 9 kHz and 7.5 GHz or in a frequency range between 9 kHz and 20 MHz or in a frequency range between 20 MHz and 200 MHz or in a frequency range between 200 MHz and 500 MHz or in a frequency range between 500 MHz and 7.5 GHz.

9. A measurement arrangement comprising:
a portable directional antenna, which is designed to detect position-finding data of an interference source emitting an electromagnetic interference signal, comprising an installed camera which is configured to capture image information from the surroundings of the directional antenna, in particular from the surroundings of the interference source,
a control device configured to control the camera and the portable directional antenna, wherein the control device is configured to adjust the size of the opening angel of the directional antenna to become smaller or bigger, and
a measurement device designed as a spectrum analyser which is coupled to the directional antenna and which is designed to analyse an electromagnetic interference signal received by the directional antenna,
wherein the control device is coupled to the camera and is designed so as to trigger the camera in a manner dependent on a predetermined condition,
wherein the control device is designed to trigger the camera automatically in a manner dependent on the predetermined condition, the predetermined condition denoting at least one threshold for the detected electromagnetic signal, and
wherein the threshold for the detected electromagnetic signal is a threshold for the scattering of the detected electromagnetic interference signal.

10. The arrangement of claim 9, wherein an input device is provided, via which user-specific inputs on the position or the nature of the interference source emitting the detected electromagnetic interference signal or both of them can be inputted.

11. The arrangement of claim 10, wherein the control device is designed to assign the user-specific inputs to the captured image information or detected position-finding data and to store the information thus linked together as associated information in a memory.

12. The arrangement of claim 9, wherein a display device is provided which is designed to display at least one of: captured image information, detected position finding data, GPS data, time information, user-specific inputs or data analysed by the spectrum analyser.

13. A method for locating a radio-frequency interference source, comprising:
adjusting the size of an opening angle of a directional antenna to become smaller or bigger,
determining the position of an interference source by detecting and analysing an electromagnetic interference signal emitted by the interference source via the directional antenna and by providing position-finding data based on a direction of incidence of the detected electromagnetic interference signal;
determining the presence of a predetermined condition, the predetermined condition denoting at least one threshold for the detected electromagnetic signal, wherein the threshold of the detected electromagnetic signal is a threshold for the scatting of the detected electromagnetic interference signal;
dependent on the determined presence of the predetermined condition, automatically capturing image information from the surroundings of the interference source or from the location at which the electromagnetic interference signal was detected; and
storing the determined position and the associated image information.

14. The method of claim 13, the method comprising at least one of:
detecting a distance between the interference source of the electromagnetic signal and a location at which the electromagnetic interference signal was detected;
characterising the detected and analysed electromagnetic interference signal;
adapting a focus or a zoom of the capture as a function of the detected distance;
displaying the captured image information together with further information relating to the interference source;
detecting GPS position data of the location at which the position of the interference source was determined;
determining time data of the moment at which the position of the interference source was determined;
comparing a predetermined parameter of the electromagnetic interference signal with a predetermined threshold;
merging information about the detected direction of incidence of the electromagnetic interference signal into the image information.

* * * * *